United States Patent
Hertz et al.

(10) Patent No.: US 7,073,252 B1
(45) Date of Patent: Jul. 11, 2006

(54) METHOD FOR MAINTAINING OPERABILITY OF A FLEXIBLE, SELF CONFORMING, WORKPIECE SUPPORT SYSTEM

(76) Inventors: Allen David Hertz, 12784 Tulipwood Cir., Boca Raton, FL (US) 33428; Eric Lee Hertz, 125 Freddie St., Indian Harbour Beach, FL (US) 32937

( * ) Notice: Subject to any disclaimer, the term of this patent is extended or adjusted under 35 U.S.C. 154(b) by 64 days.

(21) Appl. No.: 10/785,371

(22) Filed: Feb. 24, 2004

Related U.S. Application Data

(60) Division of application No. 09/597,905, filed on Jun. 19, 2000, now Pat. No. 6,695,298, which is a continuation-in-part of application No. 09/253,238, filed on Feb. 19, 1999, now Pat. No. 6,264,187, which is a continuation-in-part of application No. 09/170,016, filed on Oct. 13, 1998, now Pat. No. 6,029,966.

(51) Int. Cl.
*H05K 43/00* (2006.01)

(52) U.S. Cl. .............. 29/829; 29/874; 29/739; 269/266

(58) Field of Classification Search ............ 29/729, 29/739–740; 269/266–269, 25, 309, 296, 269/20
See application file for complete search history.

(56) References Cited

U.S. PATENT DOCUMENTS

| 4,730,159 | A | * | 3/1988 | Collins | 324/757 |
| 5,124,646 | A | * | 6/1992 | Shiraishi | 324/761 |
| 5,152,707 | A | * | 10/1992 | Dougherty et al. | 445/52 |
| 5,551,677 | A | * | 9/1996 | Puettmer et al. | 269/266 |
| 5,984,293 | A | * | 11/1999 | Abrahamson et al. | 269/266 |
| 6,029,966 | A | * | 2/2000 | Hertz et al. | 269/266 |
| 6,412,685 | B1 | * | 7/2002 | Hertz et al. | 228/246 |
| 6,497,403 | B1 | * | 12/2002 | Ries | 269/266 |

* cited by examiner

*Primary Examiner*—Minh Trinh
(74) *Attorney, Agent, or Firm*—Allen D. Hertz

(57) ABSTRACT

A method is disclosed for maintaining a reliable operation of a flexible, self-conforming support system. The self-conforming support system utilizes a plurality of pins that move vertically within a series of apertures. The motion of the pins can be hindered with unwarranted material becoming lodged between the pins and the respective aperture. One scenario where this is highly probable is when using the self-conforming support system for supporting Printed Circuit Boards during a solder paste application process. The present invention utilizes a protective collar to deflect any excess solder paste from becoming lodged between any of the pins and the respective aperture. The collar is essentially an umbrella, and can be of a molded material, a pliant material, or machined into the pins. The collar can further include a pliant top which also protects the Printed Circuit Board from the pins.

7 Claims, 12 Drawing Sheets

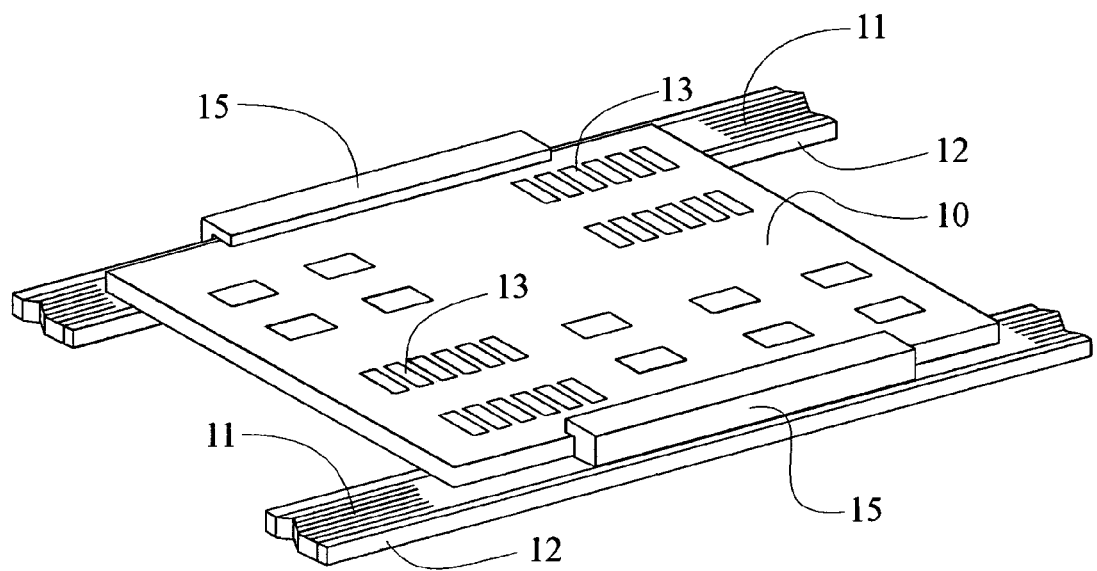
Background　　　　　　　　　　　　FIG. 1
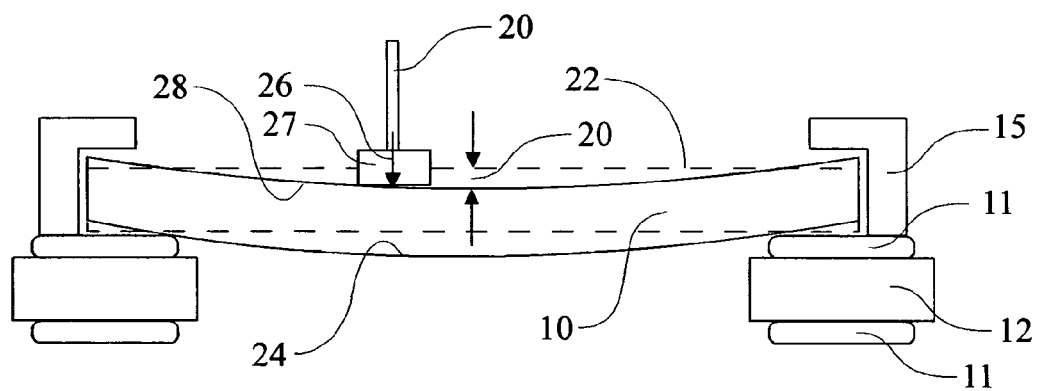
Background　　　　　　　　　　　　FIG. 2

METHOD FOR MAINTAINING OPERABILITY OF A FLEXIBLE, SELF CONFORMING, WORKPIECE SUPPORT SYSTEM

FIELD OF THE INVENTION

The present invention relates to accessories for flexible support systems using elongated support members that vary in position to support planer and/or three-dimensional workpieces. This is a divisional application of Ser. No. 09/597,905 filed Jun. 19, 2000 (Issuing as U.S. Pat. No. 6,695,298 on Feb. 24, 2004) as a CIP of Ser. No. 09/253,238 filed 1999, February 19 (Now U.S. Pat. No. 6,264,187 Issued Jul. 24, 2001) which is a CIP of Ser. No. 09/170,016 filed 1998, October 13 (Now U.S. Pat. No. 6,029,966, Issued Feb. 29, 2000). The application further claims priority to application of Ser. No. 10/090,076 filed Feb. 28, 2002.

BACKGROUND OF THE INVENTION

Numerous manufacturing processes require a means to support a workpiece, without causing damage, so that an operation can be effected thereon, particularly an operation which applies a force or pressure to the workpiece, such as a printed circuit board (PCB) during printing or population. The face of the workpiece to be supported may not necessarily be planer, as demonstrated by the example of a two-sided electronics assembly; at least one application requires tooling to support a three dimensional face.

There are several known apparatuses, which utilize elongated support members, which conform to the profile of the contact surface of the workpiece.

Thyberg et al. teach an apparatus using a multiplicity of hard balls and the application of pressure to the balls to provide a simple and effective locking mechanism. The elongated support members include ridges formed perpendicular to the axis of motion, whereby pressure (shown as by displacing the balls with an additional member) can be applied to the multiplicity of hard balls to effectively lock about the said ridges.

Frosch et al. teach a plurality of spindles (elongated support members), which contour to the workpiece and are secured in position using a locking piston associated with each spindle (or pair of spindles). The elongated support members are raised to the workpiece using springs.

Barozzi teaches a multiplicity of parallel pins in parallel rows, which utilize friction to arrest the pins to the respective position. The frictional locking means consist of elastic elements interpositioned with elastic deformation between each of the parallel rows of pins. Barozzi utilizes flat springs located along parallel pins.

Dougherty et al. teach an anvil (plurality of elongated support members) having a uniquely configurable face where the elongated support members are raised by a fluid (air, fluid, or similar) directly contacting the pins. The pins are then retained against any downward force by individual sleeves with slits that are placed about the shaft of the pins; the sleeves are compressed inwardly when under external pressure exerted by elastomeric tubes that enclosed the slit sleeves.

Puettmer, et al. teach a profiled clamping jaw, whereby the profiling process utilizes a fluid and individual needle valves to raise and hold the plurality of pins to a contour. The apparatus comprises of a complex system to individually move and hold each clamping ram (elongated support member) in position. The system does not allow the removal of any of the clamping rams.

Beale teaches an apparatus that provides support for a predetermined position raising and lowering only specified support members. Beale further teaches an apparatus which can secure a workpiece to a fixture using thin clamping foils which will not damage or interfere with the screen printing process.

Each of the above contouring support apparatuses is limited where they do not provide a means for easy removal or re-installation of any of the elongated support members.

The two parent applications disclose several apparatuses for supporting a workpiece using a plurality of elongated support members, which adjust to conform to the profile of the surface of the workpiece to be supported.

The flexible, self-conforming workpiece support systems disclosed in the parent applications, as well as similar apparatuses such as the cited arts may be subjected to harsh environments such as solder printing. Solder paste, used during the solder printing process, is known to drop into the solder printing apparatus. The solder paste comprises of small (approximately 0.0008" diameter) spheres of solder (tin lead) mixed in flux paste to a viscosity of approximately $1\times10^6$ centipoise. When dried, the solder paste may have properties similar to clay or cement. The small particles of solder may act as abrasives.

The flexible, self-conforming workpiece support systems disclosed in the parent applications, as well as similar apparatuses such as the cited arts may provide an upward force to the workpiece during the profiling process. This said upward force could cause the workpiece to flex upwards.

What is desired is a system, which is flexible, can automatically create a profile to support the face of any workpiece, including a non-planer surface, and minimizes any forces transferred to the said face. The system should be designed to be repeatable, serviceable, and with minimal complexity. Further, the system should incorporate a method, features and or accessories to increase repeatability and reliability.

SUMMARY OF THE INVENTION

One aspect of the present invention is to provide a means to support one face of a workpiece to support the workpiece during an operation in which a force is applied to another face of the workpiece.

A second aspect of the present invention is to provide a means to support the workpiece using a plurality of elongated support members, whereby the plurality of elongated support members may create a profile of the contact face of the workpiece.

A third aspect of the present invention is to provide a, preferably automated, means to reset the elongated support members to the predetermined, "maximum" distance from the primary assembly position, where the elongated support members are temporarily held in position by a resistive force. The elongated support members are adjusted to the desired height by bringing the workpiece and the primary assembly together, where the surface of the workpiece adjusts the elongated support members against a resistive force to the desired heights.

A fourth aspect of the present invention is to provide a holding force to hold the elongated support members after the elongated support members are positioned in the desired profile.

A fifth aspect of the present invention is the ability to easily remove or install any of the said support members from the primary assembly of the invention.

A sixth aspect of the present invention is a method to vary the size of the array of elongated support members to match the variety of subject workpieces.

A seventh aspect of the present invention is a method and apparatus to control the height of the support elongated support members to either in the maximum distance from the primary assembly or minimum distance from the primary assembly.

An eighth aspect of the present invention is an apparatus used to protect the shaft of the elongated support members from foreign objects such as solder paste.

A ninth aspect of the present invention is the inclusion of the protective member in a molded compliant member, which slides over the top of the elongated support member.

A tenth aspect of the present invention is a method of temporarily reinforcing the workpiece to provide a planar top surface.

An eleventh aspect of the present invention is an apparatus for temporarily reinforcing the workpiece to provide a planar top surface.

A twelfth aspect of the present invention is the ability to automatically profile the plurality of elongates support members to the underside of the workpiece.

A thirteenth aspect of the present invention is the ability to use the same member to profile the plurality of pins to the one face of the workpiece as well as holding the plurality of pins to the profile against force(s) applied to the another face of the workpiece.

A fourteenth aspect of the present invention is the ability to raise the plurality of elongated support members using at least one of: springs, a reset plate in conjunction with a resistive member, or fluid.

A fifteenth-aspect of the present invention is the inclusion of a single molded member to act as individual pistons to contour the plurality of elongated support members.

A sixteenth aspect of the present invention is the inclusion of a single member to seal each individual piston to maintain the contour of the plurality of elongated support members.

A seventeenth aspect of the present invention is the ability to limit the height of the individual pistons during the contouring process.

An eighteenth aspect of the present invention is the ability to retract the elongated support members by the removal of fluid.

A nineteenth aspect of the present invention is the inclusion of a means to individually identify each respective perforation for each respective elongated support member to identify a desired pattern for a particular workpiece.

The invention, a method and apparatus comprising:

A mechanism, which can profile a plurality of elongated support members to a surface of an object. Several options are described herein, including springs, a resistive member (magnetic, frictional, or similar), and fluid in conjunction with a molded member.

A mechanism that can maintain the position of the elongated support members in a contoured position. Several options include a sliding single perforated plate to apply a clamping holding force, increasing the resistance force from a resistive member such as by increasing the magnetic force, and sealing a fluid within the above described molded member.

A mechanism of ensuring the planarity of the workpiece whereby the mechanism is placed against the workpiece, the second planar object can be a support block, stencil (and optional squeegee), and the like.

A protective member for protecting the shaft of the elongated support members and the openings in the apparatus from foreign materials such as solder paste. The member can be included in a molded compliant member and placed around or over the top of the elongated support members.

The elongated support members can optionally have a mechanism that that allows the elongated support member to be assembled into the primary assembly, while allowing the elongated support member to by removed as desired. Options include a "C-clip", a rotating securing mechanism, a removable plate and the like.

The top surface of the apparatus can also be marked to identify the locations of each elongated support member individually as a means to provide an operator with a repeatable process for arrangement of installed/not-installed elongated support members.

BRIEF DESCRIPTION OF THE DRAWINGS

FIG. 1 is an isometric view of a workpiece; in this case a Printed Circuit Assembly (PCA) located on the conveyor of a workstation.

FIG. 2 is a sectional side elevation that illustrates the undesirable deformation of the workpiece, in this case a PCA, during the operation of a workstation.

DETAILED DESCRIPTION OF THE INVENTION

Figure 3:
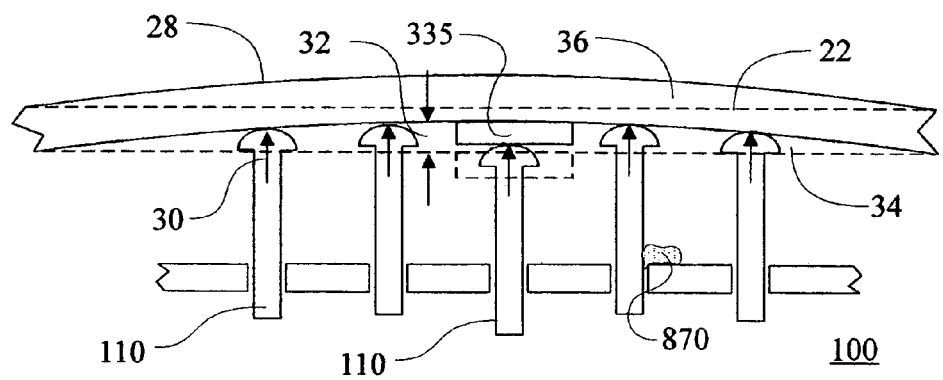
FIG. 3 illustrates limitations of the prior art as well as the parent applications whereby the workpiece may flex upwards during the profiling process and be susceptible to foreign materials such as solder paste.

FIG. 1 is an isometric view of a PCA (module) 10 illustrating the workpiece 10 located on a conveyor belt 11 within the workstation (not shown). The workpiece 10 is transferred into and out of the workstation via a conveyor belt 11. The conveyor belt 11 rides along the conveyor rail 12. After transferring the workpiece 10 to the desired location within the workstation, the workpiece 10 is secured into location using a securing mechanism 15, in this case illustrated as clamps. Optionally, some workstations use vacuum, which is not shown in this figure. The workpiece 10 is secured to ensure accuracy throughout the operation of the workstation. One reason to secure the workpiece 10 into location is to maintain placement accuracy for various component locations 13.

FIG. 2 is a sectional side elevation illustrating a non-desirable deflection 20 of a workpiece 10 during the operation of a workstation. The workpiece 10 is located on the conveyor belt 11, as described by FIG. 1. The conveyor belt 11 rides along the conveyor rail 12. The workpiece 10 is secured by a securing mechanism 15 to ensure accuracy during processing. The drawing illustrates, using a dashed line; a planer surface 22 of the workpiece 10 prior to the subjection of loads 26 during the operation of workstation. The drawing illustrates a deflected surface 24 of the workpiece 10 during the subjection of loads 26 during the operation of a workstation. This particular drawing illustrates an example of the assembly process of a PCA, depicting the impact of component 27 placement, where the workstation is placing a component 27 onto a work surface 28 of the workpiece 10 using a vacuum nozzle 23. A non-desirable deflection 20 of the workpiece 10 has several negative effects of the assembly process, including moving the workpiece 10 such that the location of the workpiece 10 no longer corresponds with the registration of the equipment, bouncing the components 27 off the work surface 28 upon placement, not providing a planer surface 22 during a screen-printing process, not providing a planer surface 22 during a dispensing process, not providing a planer surface 22 during component 27 placement, or where the components 27 are then dropped (instead of placed) onto the surface 28 of the workpiece 10. It can be recognized that the implementation of a self conforming support apparatus may secure the workpiece 10 to present a planer surface 22 during screen-printing, dispensing, component placement, or other assembly process.

FIG. 3 is a cross sectional drawing which illustrates a limitation of the prior art when a flexible, self conforming support apparatus 100 contours to a non-rigid workpiece 10 such as a thin Printed Circuit Assembly. During a profiling procedure (described later), a plurality of elongated support members 110 exert a profiling force 30 onto a planar workpiece 34 causing a deflected workpiece 36, emphasized by the resulting upward deflection 32. The desired planar surface 22 is shown in the upward deflection 32 as a deflected surface 28. A component 335 is shown assembled to the contact side of the workpiece 10 to illustrate the requirement for a contouring support apparatus, particularly for two sided Printed Circuit Assemblies.

Figure 4:
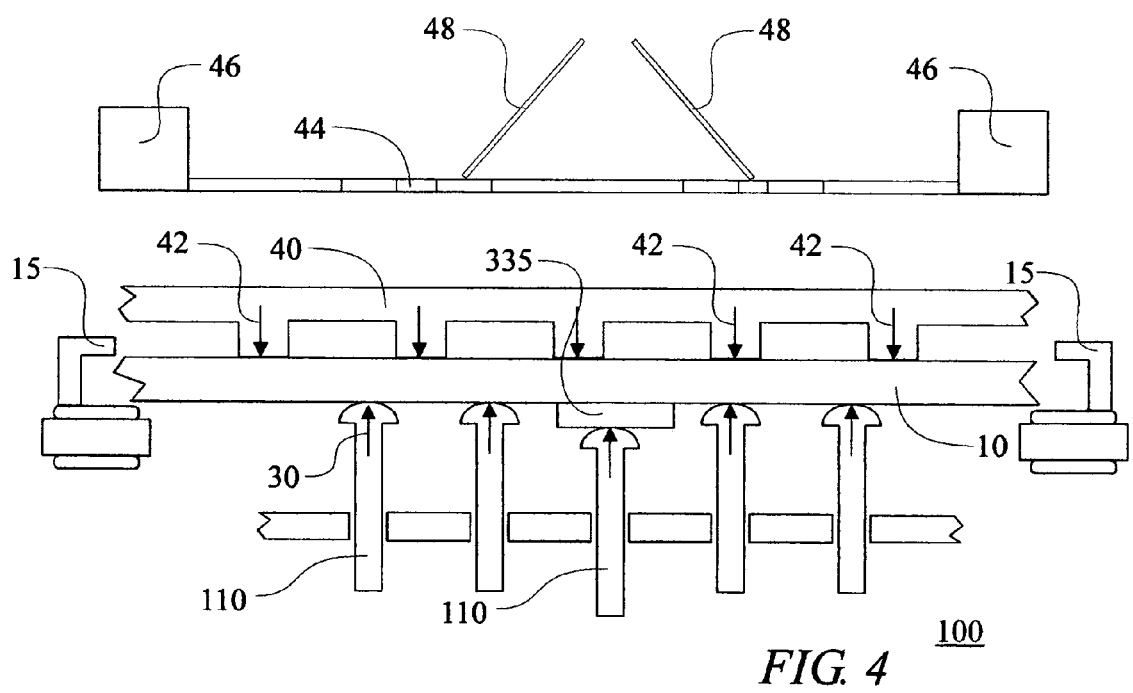
FIG. 4 illustrates a reinforcing member used to reinforce a flexible workpiece to ensure the work surface is planar.

FIG. 4 is a cross sectional drawing of a flexible, self conforming support apparatus 100 with the inclusion of a reinforcing member 40. The reinforcing member 40 would apply a generally distributed reinforcing force 42 to the workpiece 10 to ensure planarity. The reinforcing member can be a plate placed onto or clamped to the workpiece 10. Alternatively, a plate may be placed inside the workstation in workstations such as a screen printer or a stencil 44 tightly mounted within a stencil frame 46 can be used in conjunction with securing mechanism 15 as described by Beale (see background). The stencil 44 although tightly mounted within a stencil frame 46, is known to be flexible, and should further reinforcement be required, squeegee(s) 48 may be lowered to contact the stencil 44 effectively further stiffening the stencil 44.

Figure 5:
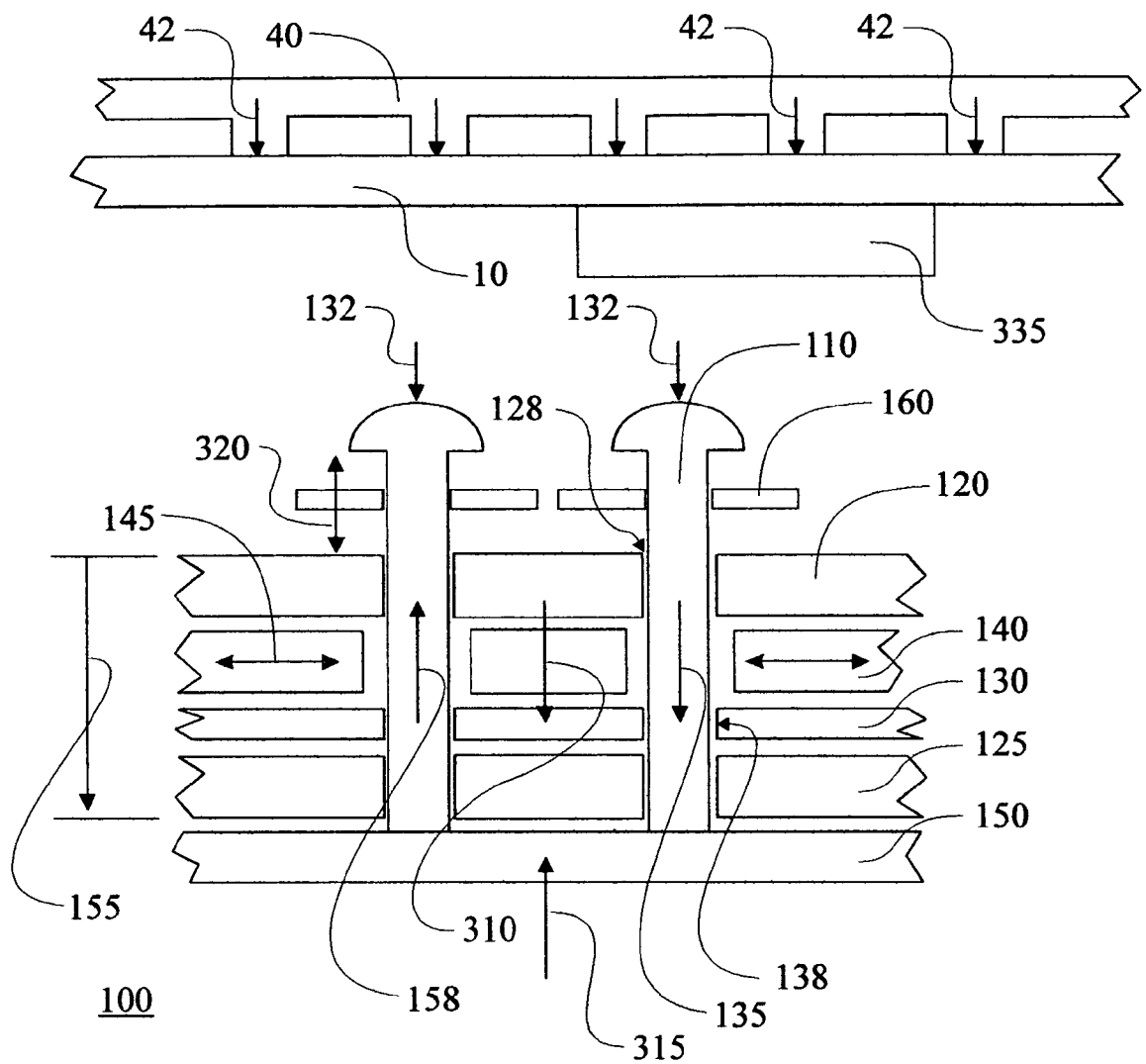
FIG. 5 is a cross sectional drawing which illustrates a flexible, self conforming workpiece support system in a reset state and one embodiment of a protective collar accessory.

FIG. 5 is a cross sectional drawing of the flexible, self conforming support apparatus 100 illustrating the elongated support members 110, preferably arranged in an array (not shown) to support a workpiece 10, further illustrating the ability to provide support to a three dimensional object by including a component 335 attached to the workpiece 330. The elongated support members 110 are held primary parallel by at least one perforated planer member 120, 125, where the preferred embodiment would be two perforated planer members 120 and 125, which have similar patterns of perforations 128 designed to allow the elongated support members 110 to adjust perpendicularly 135 to the plane of the at least one perforated planer member 120 and/or 125. The elongated support members 110 may be temporarily held in position by the frictional forces enduced by a resistance member 130. The resistive member 130 comprises any material capable of creating a retaining force (not shown) at the point of contact 138, where when a profiling force 132 or reset force 153 is applied to the elongated support members 110 the force causes the elongated support members 110 to move downward 135 or reset upwards 158. Examples of resistive material are foam, rubber, woven mesh, magnets and the like. This system can be designed to control the force 132 required to move each elongated support member 110. The plurality of elongated support members 110 can be reset to a home position 320. Alternatively, springs or fluid may be used in place of the resistive member 130 and reset plate 150 and will be described later.

The figure further illustrates two accessories in conjunction with the present invention: a protective collar 160 and reinforcing member 40. The protective collar 160 may be formed, coupled to, and the like to the elongated support members 110. The protective collar 160 is an enlarged member to keep foreign material such as solder paste (not shown in this figure) from gathering around, contacting, or interfering with the shaft of the elongated support members 110 and the perforations 128. The protective collar 160 would be preferably placed as low as possible and as large as possible to shadow the Shaft from foreign material. It can be recognized that there are many methods to manufacture the protective collar 160 and couple it to the elongated support members 110. Stamped metal may be slid over and coupled to the shaft. The elongated support member may be machined, cast or molded including the protective collar 160. The preferred embodiment would be to mold the protective collar of a pliant material whereby the molded protective collar 160 would slide over the contacting end of the elongated support member 110 and also provide protection between the contacting surface of the elongated support members 110 and the contacting surface of the workpiece 10. This will be illustrated in a later figure.

Figure 6:
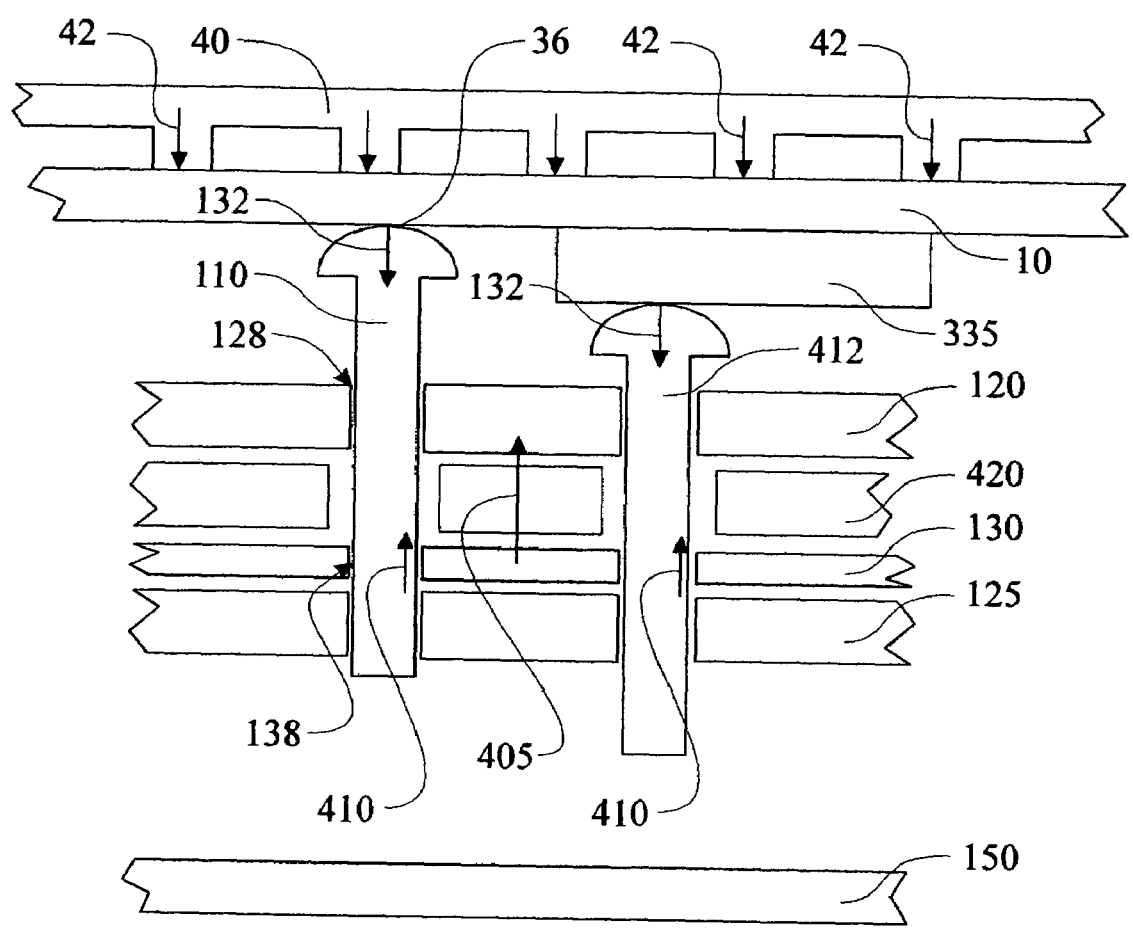
FIG. 6 is a cross sectional drawing which illustrates the flexible, self conforming workpiece support system in an adjusting state. The drawing includes the forces imposed, resulting from the motion of the apparatus.

FIG. 6 illustrates a profiling state of the flexible, self-conforming support apparatus. A contacting surface 36 of the elongated support members 110, 412 contacts the workpiece 10 and/or features which extend beyond the primary plane of the workpiece (protrusions/components/etc.) 335, respectively, whereby the workpiece 10 or features 335 exert a profiling force 132 onto the elongated supporting members 110, 412. The profiling force 132 overcomes the resistive force 410 and causes the elongated supporting members 110, 412 to move down replicating the profile of the workpiece 10 and respective protrusions 335, as shown by comparing the reset (not moved) position of the elongated support member 110 to the profiled (moved) position of the elongated support member 412.

The resistive force(s) 410 can generate a lifting force (opposite the profiling force 132) causing the workpiece 10 to bend upwards as illustrated in FIG. 3. The figure illustrates the utility of the reinforcing member 40 against the generally opposing side of the workpiece 10 to reinforce the workpiece 10 against any resulting lifting forces. Alternatively, the workpiece 10 may be placed in a position against the stencil (item 44 of FIG. 4), using the stencil as a reinforcing member 40. To further stiffen the stencil (item 44 of FIG. 4), the squeegees (item 48 of FIG. 4) or another rigid object may be placed against the stencil (item 44 of FIG. 4).

Figure 7:
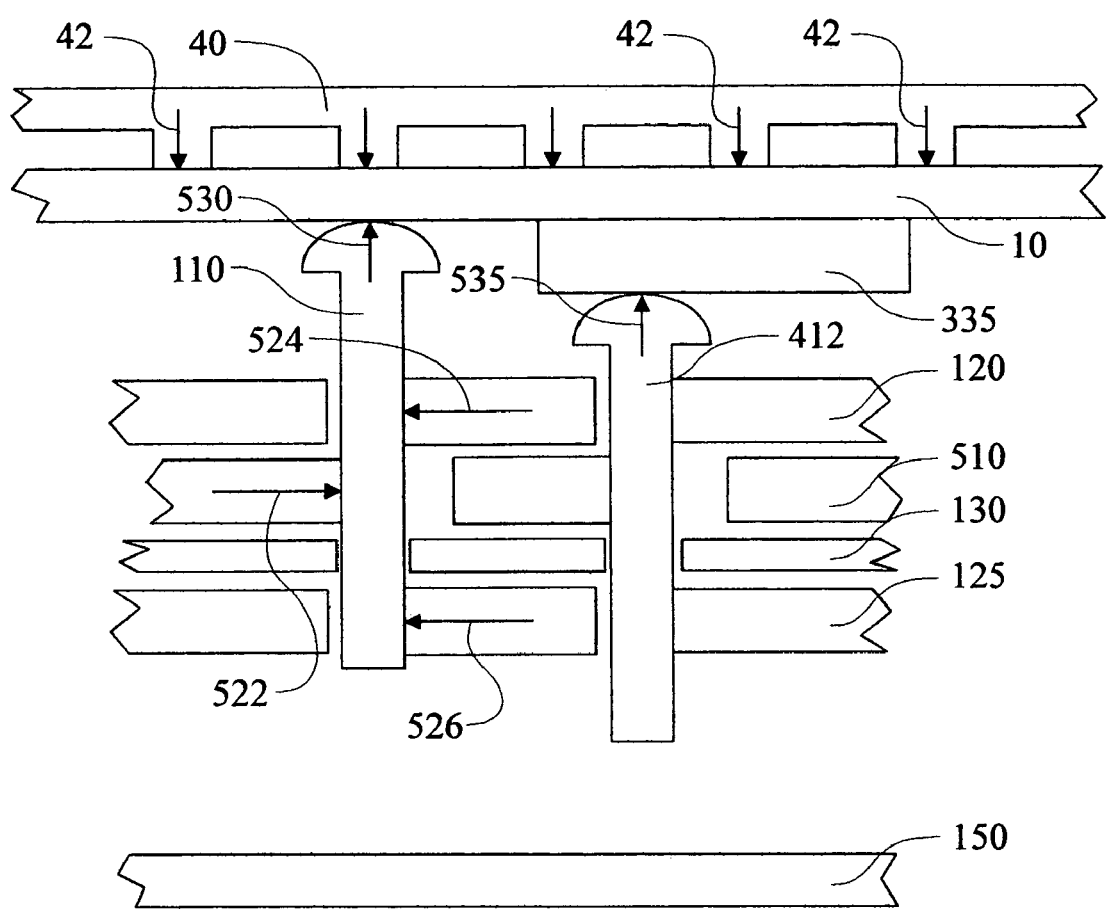
FIG. 7 is a cross sectional drawing which illustrates the flexible, self conforming workpiece support system in a secured state.

FIG. 7 illustrates the flexible support apparatus 100 in the locked state. The figure illustrates the elongated support members 110, 412 located against the workpiece 10 and the protruding member 335 respectively. The elongated support members 110, 412 are temporarily held in location by the resistance member 130. The locking member illustrated in the locking position 510, exerts a force 522, pushing the elongated support members 110, 412 against the perforated upper plate 120 and/or perforated lower plate 125. The perforated upper plate and/or perforated lower plate exert a supporting force 524, 526 respectively. The applied clamping forces 522, 524, and 526 secure the elongated support members 110, 412 in position to create a supporting force 530 onto the workpiece 10 and a supporting force 535 onto the attachment 335 to the workpiece 10.

Figure 8:
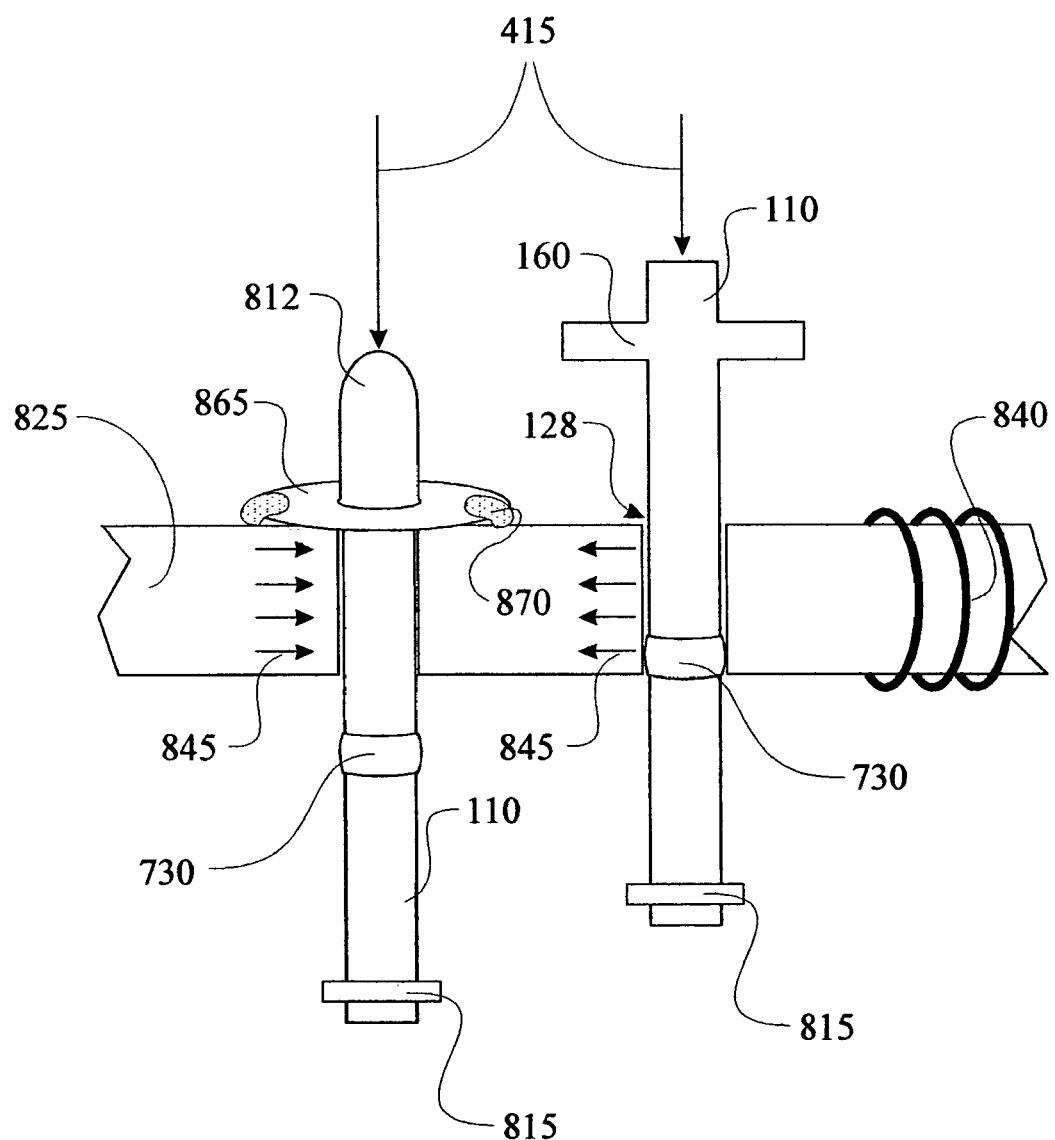
FIG. 8 is a cross sectional drawing which illustrates the elongated support member used in conjunction with a magnetic or mechanical resistance system, where the elongated support member is designed to drop after the elongated support member travels beyond a specified distance. The drawing further describes an alternative embodiment of the present invention, utilizing a variable magnetic force to provide a resistive force and holding force to the elongated support members. The drawing further includes a second and third embodiment of a protective collar.

FIG. 8 illustrates examples of an alternate embodiment of the present invention. The illustrated embodiment utilizes a magnetic resistive member 825 in conjunction with at least one of an elongated support member 110 of magnetic material or at least a portion of the elongated support member 110 of magnetic material. A resistive force 845 is applied by friction created between the surface of the elongated support member 110 and the resistive member 825 by the normal forces generated by the magnetic attraction between the two interfaces. A holding force is created by increasing the magnetic force 845 by increasing the current through a magnetic force generating coil 840 and the like. The elongated support members may be removably located within the apparatus and temporarily secured by a securing mechanism 815, where the example illustrated is a clip located in a slot (not shown) within the elongated support member 110. The securing mechanism 815 is used to secure the elongated support members 110 in the primary assembly during handling whereby the securing mechanism 815 allows the elongated support members 110 to be easily removed from the primary assembly as desired by removing the securing mechanism 815 from the elongated support member 110.

A protective collar 160, 865 is included in the figure illustrating two alternate embodiments: a first protective collar 160 that is manufactured 160 into the shaft of the elongated support member 110 and a second being a separate molded protective collar 865 which includes a pliant means between the elongated support member 110 and the workpiece (10 in other figures). The protective collar 160, 865 can be described as a member which acts similar to an umbrella; a member larger than the area to be protected from foreign materials. The example illustrated utilizes the protective collars 160, 865 to protect the region between the shaft of the elongated support members 110 and the perforation 128 from the foreign material 870 such as solder paste. The foreign material 870 would accumulate on top of the protective collar 160, 865, away from the subject interface; thus increasing the reliability of the apparatus.

The preferred embodiment is the molded protective collar 865, whereby the molded protective collar 865 would be molded of a pliant material compatible with alcohol or other flux removing fluids for cleaning. The removable, molded protective collars 865 are easy to manufacturing, inexpensive to manufacture, easy to clean and replace, and the like. Included in the figure is an optional automatic dropping feature 730, whereby the automatic dropping feature 730 of the figure is a small magnetic band coupled to the elongated support member 110. The automatic dropping feature 730 is located along the shaft of the elongated support members in such a manner as to provide a resistive force from the resistive member 825 (also 130 herein with regards to other figures) while the automatic dropping feature 730 contacts the resistive member 825, 130. Once the automatic dropping feature 730 is located beyond a contacting area of the resistive member 130, 825, the resistive force no longer supports the elongated support member 110 and the elongated support member 110 drops and no longer provides a supporting force to the workpiece 10.

The above, automated dropping feature 730 utilizes magnetic forces. An alternative automated dropping feature 730 can utilize friction, where the automatic dropping feature illustrated is an increase in width of the elongated support member 110 for use in conjunction with a mechanical/frictional resistance plate 130. The enlarged area would create a frictional resistance within a perforation of the resistive member 130. For example, the diameter of the automatic dropping feature 730 would be slightly larger than the diameter of the opening in a foam resistive member 130 and the shaft of the elongated support member 110 is smaller than the diameter of the opening in the foam resistive member 130. Once the automatic dropping feature 730 is no longer within the opening of the resistive member 130, gravity would cause the elongated support member 110 to automatically drop. The automated dropping feature 730 may be included in the shape of the elongated support member 110 or added by coupling a second piece 730 to the elongated support member 110.

Figure 9:
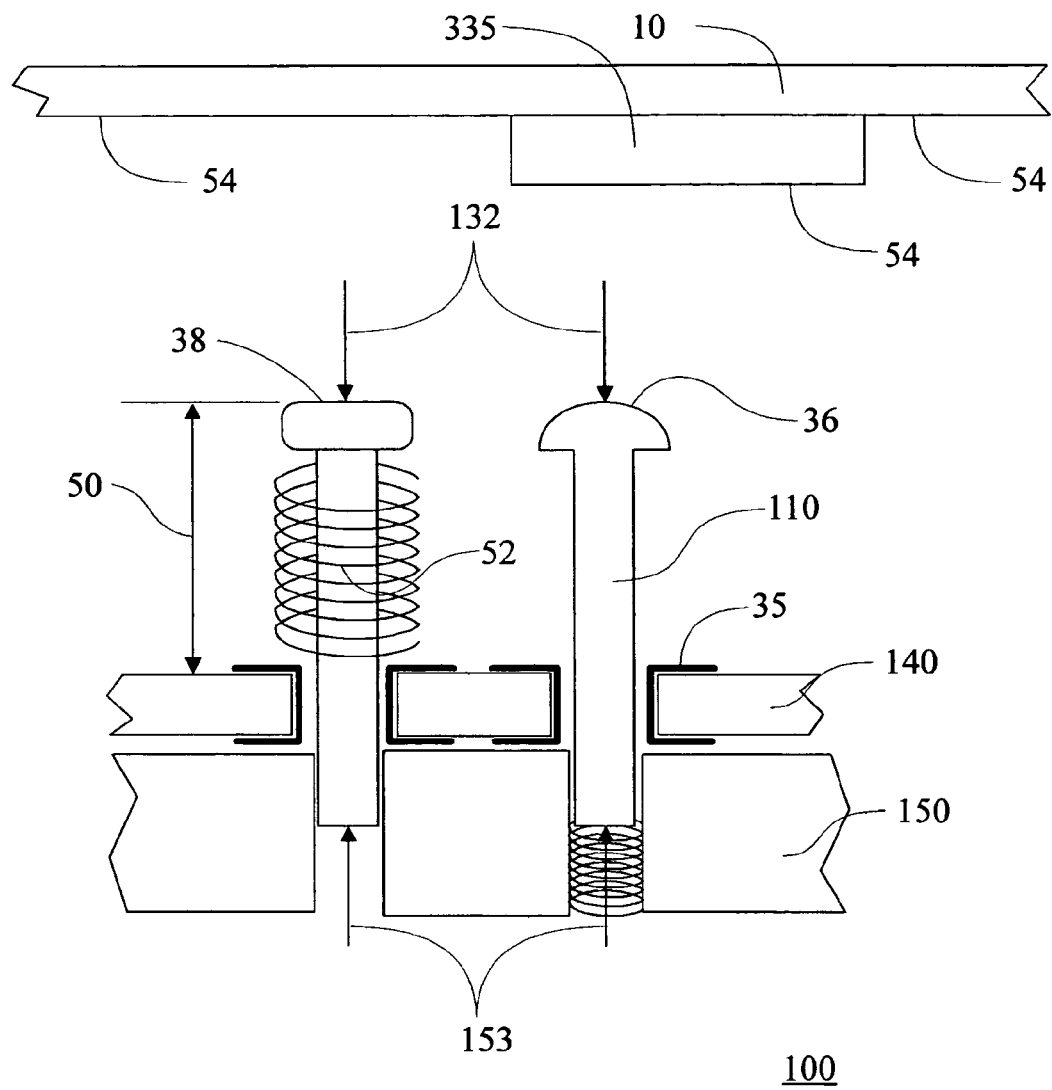
FIG. 9 is a sectional side elevation which illustrates a flexible support apparatus in the reset state or home position, illustrating an alternate embodiment of the present invention, whereby springs are used to reset the flexible support apparatus to the home position and create a resistive force. Additionally, the figure illustrates the inclusion of a pliant material on a contact end of the elongated support member and the locking mechanism.

FIG. 9 illustrates a flexible support apparatus 100 in a home position 50. The elongated support member(s) 110 are placed to the home position 50 by a homing force 153. A coil spring is used in this figure to illustrate a self restoring mechanism 52 used to apply the homing force 153. The self restoring mechanism 52 can be located above the flexible, self conforming support apparatus 100 as illustrate by a first embodiment which provides for a narrow profile apparatus or located below the elongated support member 110 as illustrated by a second embodiment. It can be recognized that the springs may be located within the elongated support members as a third embodiment of the present invention. The figure illustrates the ability to remove any elongated support member 110 and the respective self restoring mechanism 52 to provide clearance for items such as conveyors 12 or extra sensitive components 335. It can be recognized that many other urging devices may be used as self-restoring mechanisms 52 may be used to apply the homing force 153. The workpiece 10 to be supported is shown above the flexible support apparatus 100 residing in the home position 50. One elongated support member 110 includes a pliant material 38 located at the end of the elongated support member 110 which contacts the workpiece 10 to avoid damage to delicate surfaces (protrusions 335) of the workpiece 10. The figure further illustrates a compliant material 35 being used to account for tolerances to ensure adequate clamping of the elongated support member(s) 110. It can be recognized that the compliant material 35 can be applied to other embodiments described herein.

Figure 10:
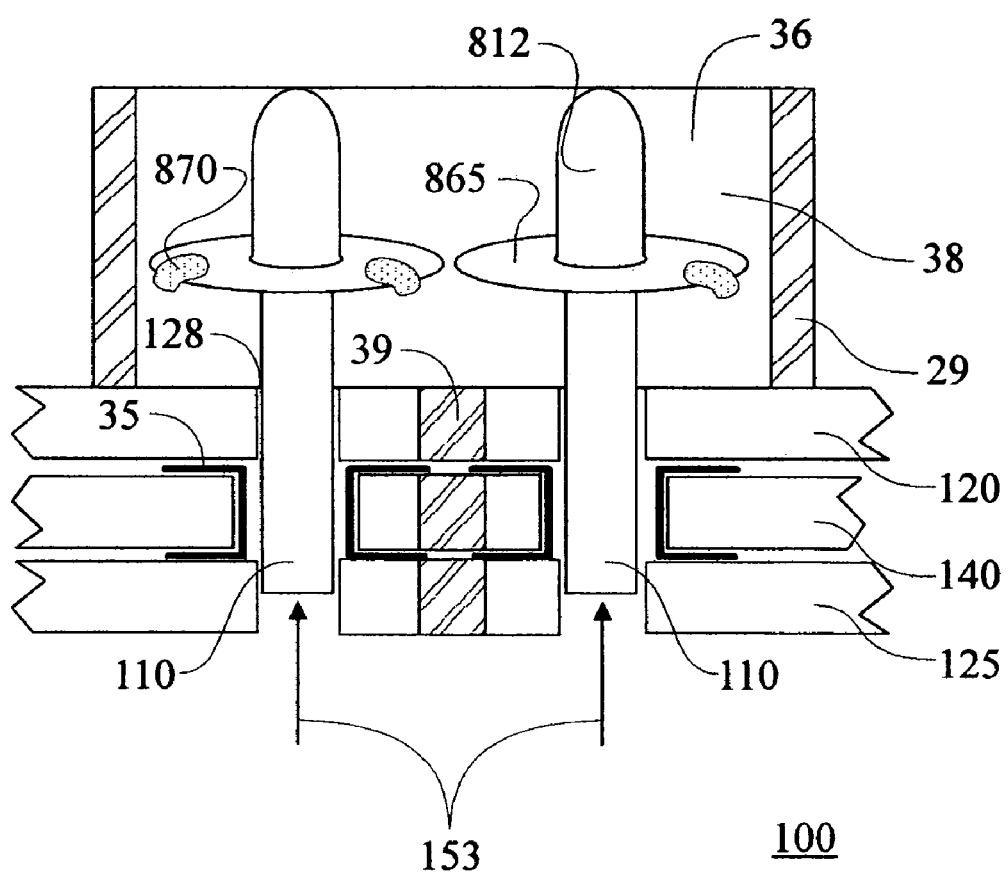
FIG. 10 is a sectional side elevation which illustrates a flexible support apparatus whereby the flexible support apparatus further includes a vacuum means of holding the workpiece for use in conjunction with workstations such as screen printers.

FIG. 10 is a sectional side elevation illustrating features of a flexible support apparatus 100 specifically designed for a screen printing workstation. Features of the flexible, self-conforming support apparatus 100 in conjunction with a screen printer include a protective collar 865, a compliant contact area 812, and a vacuum system. The vacuum system includes a vacuum passage 39 to transfer vacuum from a vacuum source (not shown) to a vacuum chamber 38, where the vacuum chamber 38 is created by vacuum wall members 29. The vacuum wall members 29 can be coupled to the perforated member 120, and preferably located within the peripheral edges of the module to optimize the vacuum. It can be recognized that the vacuum wall members may be adjustable. It can also be recognized that the vacuum chamber 38 may be included in the elongated support members 110 by making the elongated support members 110 hollow 38. The vacuum would transfer from the vacuum source through the bottom of each elongated support member 110 to the surface of the workpiece 330 (not shown). The figure illustrates the utility of the protective collars 865 whereby solder paste 870 is deflected from the shaft of the elongated support member 110.

Figure 11:
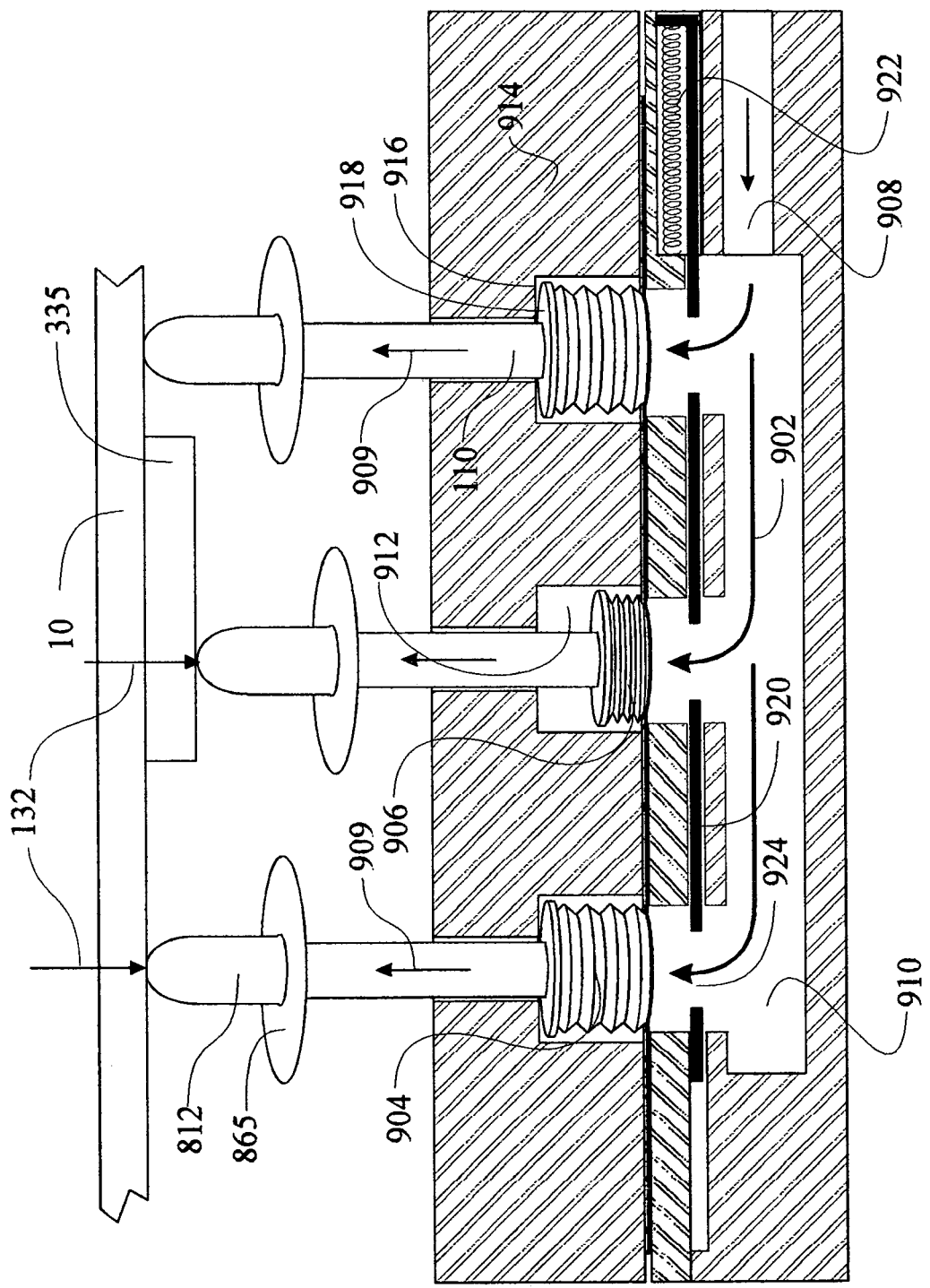
FIG. 11 is a sectional side elevation, which illustrates a flexible support apparatus in a profiling state. The preferred embodiment utilizes a molded series of expansion chambers in conjunction with a change in fluid pressure and a sliding aperture plate to raise and temporarily hold the plurality of elongated support members in a profiled state.

FIG. 11 is a sectional side elevation illustrating features of a fluid operated flexible support apparatus 900 utilizing a fluid 902 and molded series of expansion members 904, 906. The fluid 902 enters a passage 908, whereby the fluid passage 908 is coupled to a fluid pump, or similar to transfer fluid 902 into a fluid basin 910 and is distributed into the plurality of expansion members 904, 906. The fluid 902 would flow into the expansion members 904, 906 and raise 909 the plurality of elongated support members 110 to contact the workpiece 10 and protrusion(s) 335. A completely expanded member 904 is shown in an expanded state, and an partially expanded member 906 is limited in expansion as a result of a profiling force 132 from the workpiece 10 and protrusions 335. The preferred embodiment of the expansion members 904, 906 would be a single molded member with a plurality of expansion members 904, 906, manufactured of a flexible material interconnected by a flat sheet which can provide gasketing capabilities between the layers of the apparatus. The pattern of the expansion members 904, 906 can be duplicated in a pattern of expansion chambers 912 as shown being machined in an expansion chamber member 914. The expansion chambers 912 can include a maximum lift feature 916 which maintains the distance in which the expansion members 904, 906 can expand. A protection member 918 can be placed between the expansion-member 904, 906 and the elongated support members 110 to increase reliability of the molded expansion members 904, 906. A sliding seal 920 is shown in an open state allowing fluid to transfer from the fluid cavity 910 and the expansion members 904, 906. The sliding seal 920 can be of a plate with a plurality of openings 924 in a pattern similar to the pattern of expansion members 904, 906 and can be controlled by a seal actuator 922. The sliding seal can be located in a cavity within the apparatus, whereby the overall apparatus is sealed to avoid leaks.

Figure 12:
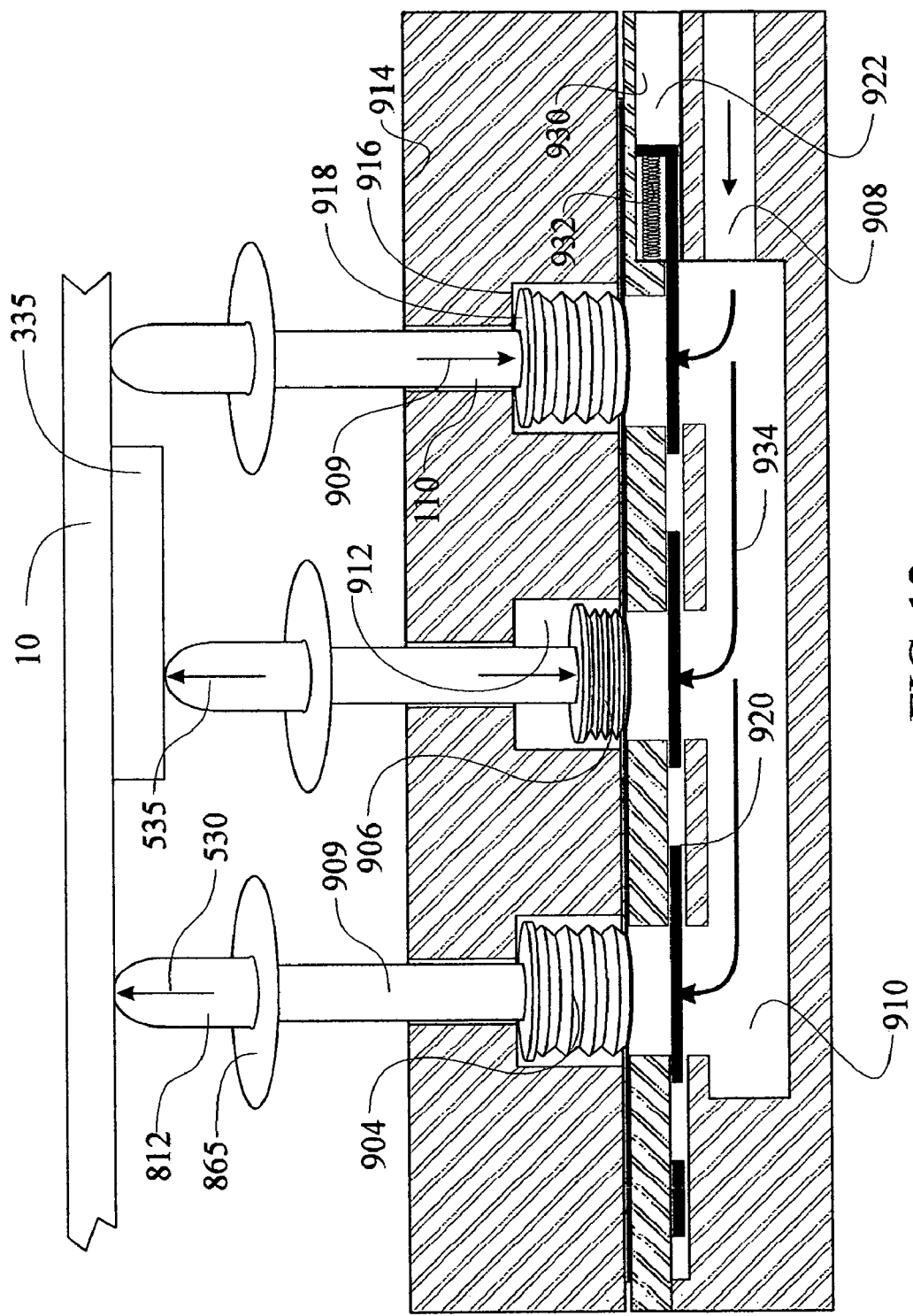
FIG. 12 is a sectional side elevation, which illustrates the flexible support apparatus of FIG. 11 in a supporting state.

FIG. 12 is a sectional side elevation illustrating a supporting state of a fluid operated flexible support apparatus 900. The sliding seal 920 adjusts by changing the state of the seal actuator 922, whereby the position of the sliding seal 920 controls the flow of fluid 902 between the expansion members 904, 906. This can minimize the flow of fluid 902 between the expansion members 904, 906, the fluid cavity 910, and other expansion members 904, 906 when engaged as shown. The fluid 902 which is isolated within the expansion members 904, 906 and the sliding seal provide a supporting force 530, 535, while maintaining a profiled position for the plurality of elongated support members 110. It should be noted that an advantage of the disclosed invention is in that the assembly may be externally sealed, not requiring detailed internal sealing features. Small flow of fluid 902 between the expansion members 904, 906 and the fluid cavity 910 does not impede the performance of the apparatus 900. The seal actuator can comprise of a fluid supporting cavity 930 and a return spring 932. By flowing fluid 902 into the fluid-supporting cavity 930, the pressure adjusts the position of the sliding seal 920. By removing the fluid 902 from the fluid-supporting cavity 930, the return spring 932 returns the sliding seal 920 to the original position. The fluid 902 can be drawn from the fluid cavity 910 causing the expansion members 904, 906 to retract, thus lowering the elongated support members 110 to a reset position. Once the sliding seal 920 is located in the sealed position, the fluid 902 can be pressurized in the fluid cavity 910 to apply sealing pressure 934 to improve the seal.

It can be recognized that the disclosed flexible, self conforming support apparatus 900 can be automated with the inclusion of sensors, software, and other related automation equipment as recognized by those skilled in the art.

It can be recognized that the disclosed flexible, self conforming support apparatus 900 can be used in conjunction with at least one of a solder screen printer, an electronic component placement machine, and a dispensing machine.

Figure 13:
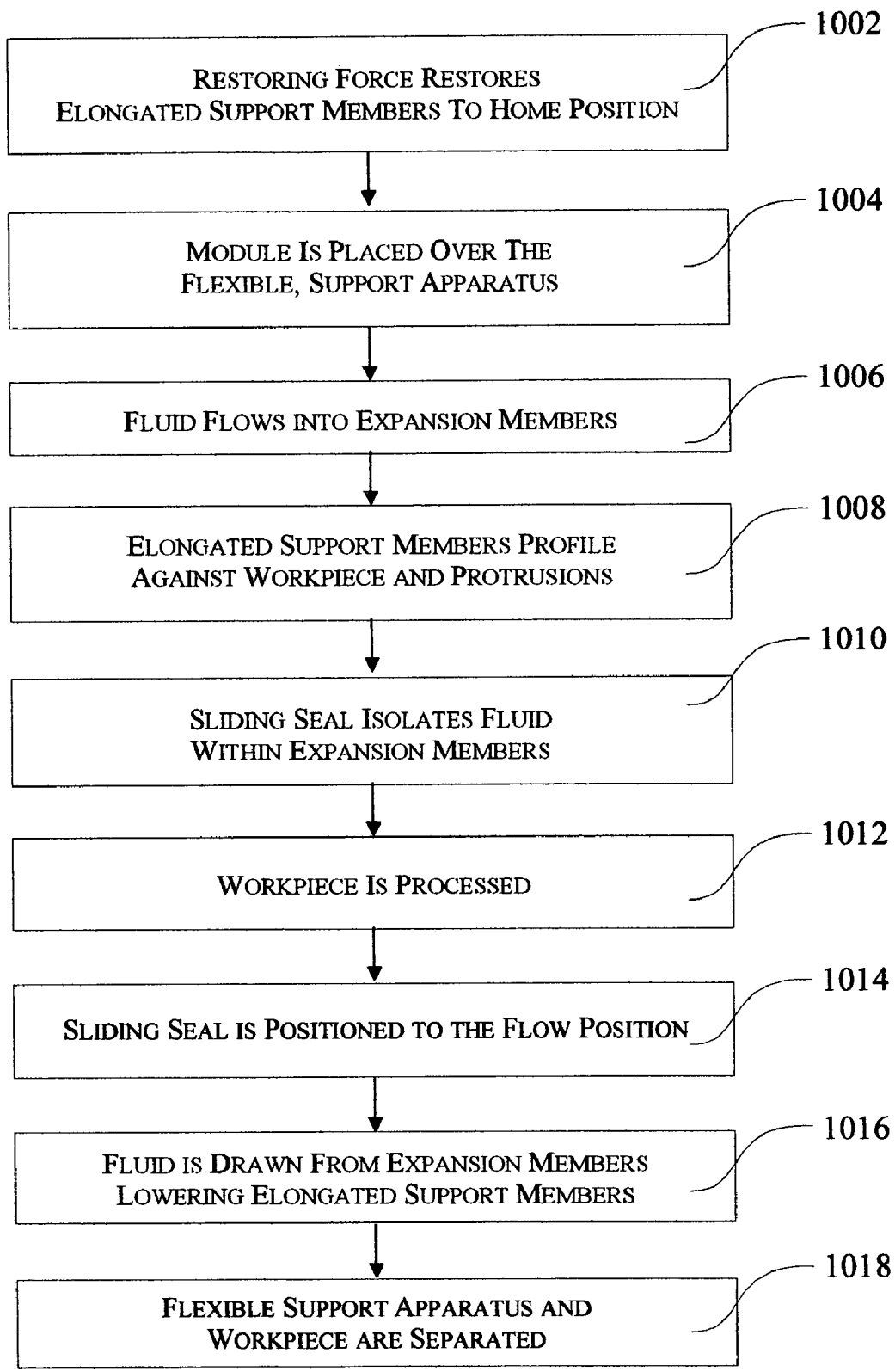
FIG. 13 is an operational flow diagram disclosing a method of the flexible support apparatus.

FIG. 13 is an operational flow diagram 1000 describing the general operational flow of a fluid operated flexible support apparatus 900. The first step 1002 is to restore the flexible support apparatus 900 where the elongated supporting member(s) 110 are placed in the home position 320 by drawing fluid from the expansion members 904, 906. The second step 1004 in the operational flow diagram 1000 is to bring the workpiece 10 and the fluid operated flexible support apparatus 900 proximate each other. The third step 1006 in the operational flow diagram 1000 is to flow fluid into the expansion members 904, 906, raising the plurality of elongated support members 110. The fourth step 1008 in the operational flow diagram 1000 is the profiling of the elongated support member(s) 110 by using the pressure from the fluid into the expansion members 904, 906 to raise the elongated support members 110 against the workpiece 10. The fifth step 1010 is to adjust the position of the sliding seal 920 to limit the flow of fluid 902 between the fluid cavity 910 and the expansion members 904, 906. By limiting the flow of fluid 902, the fluid within the expansion chamber provides a supporting force 530, 535 to the workpiece 10 and protrusion 335 respectively. The sixth step 1012 is to process the workpiece 10. The seventh step 1014 is to reposition the sliding seal 920 to allow the fluid 902 to flow between the expansion members 904, 906 and fluid cavity 910. The eighth step 1016 is to draw the fluid 902 from the expansion members 904, 906 to return the expansion members 904, 906 to the retracted position, thus lowering the plurality of elongated support members 110. The ninth step 1018 is to separate the workpiece 10 from the fluid operated flexible workpiece support apparatus 900.

Figure 14:
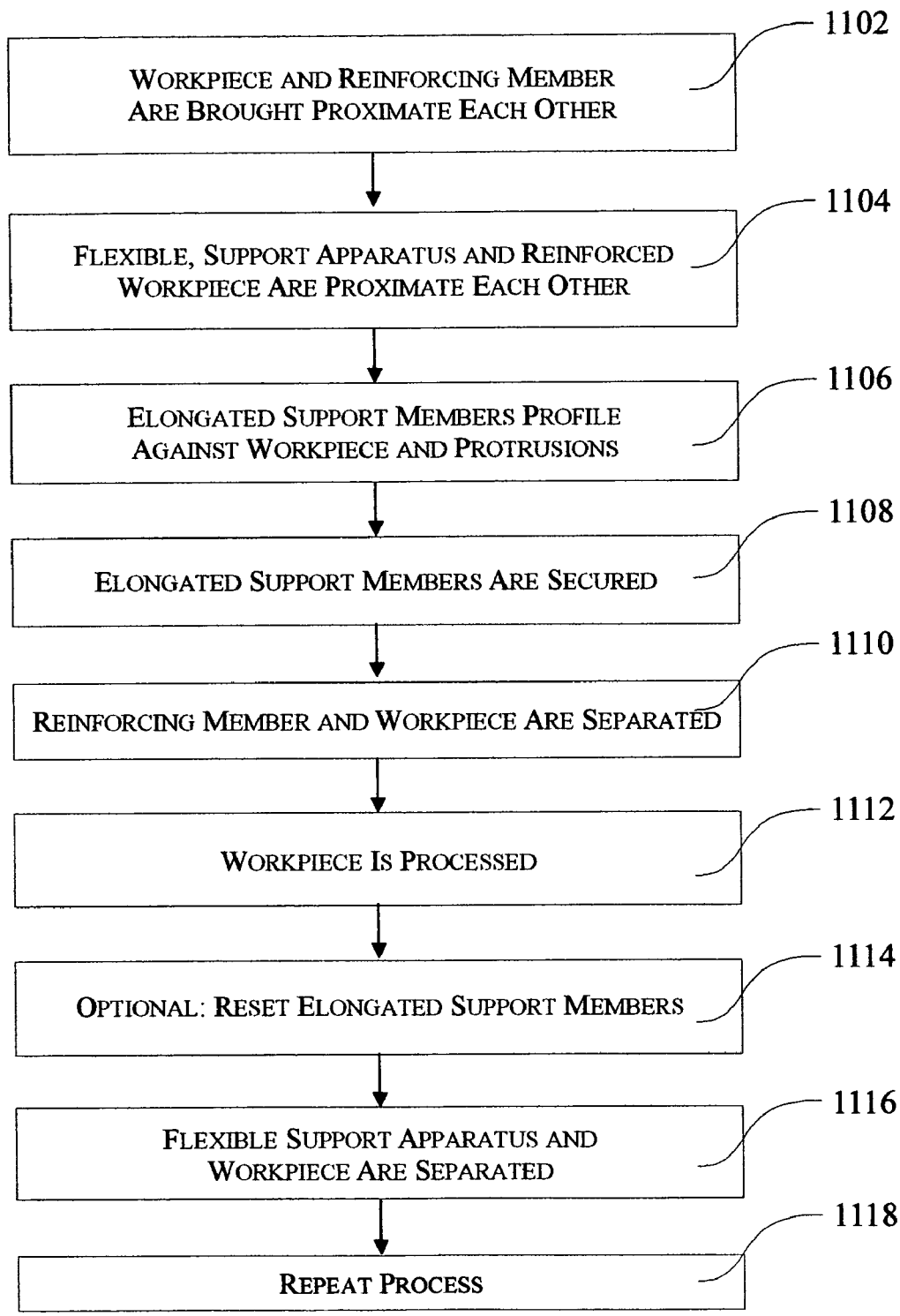
FIG. 14 is an operational flow diagram disclosing a method of reinforcing a workpiece in conjunction with a flexible self-conforming support apparatus.

FIG. 14 is an operational flow diagram 1100 describing the general operational flow of the utilization of a reinforcing member in conjunction with a workpiece 10, whereby the workpiece 10 may flex under loading imposed during the profiling process 1008 of a flexible, self conforming support apparatus 100, 900. A first step 1102 is to bring the workpiece 10 and reinforcing member 40 proximate each other. A reinforcing member 40 can be any means of coupling a planar member proximate the opposing side of the workpiece 10. Examples may include a plate, a truss or multiple of trusses, a notched extrusion (as illustrated in FIG. 4), a plurality of adjustable members that can alter the overall size to be match the size of the workpiece 10, a stencil 40, squeegee(s) 48, a combination of stencil 40 and squeegee(s) 48, and the like. It can be recognized that the workpiece 10 can be secured, using mechanical clamps 15, vacuum (see FIG. 10) and the like, prior to placing the workpiece against the reinforcing member 44. In a second step 1104, the flexible, self conforming support apparatus 100, 900 and the reinforced workpiece 10 are brought proximate each other. The second step 1104 may occur prior to the first step 1102, particularly if the workpiece 10 is secured in position. In a third step 1106, the elongated support members 110 are profiled to the workpiece 10 and any respective protrusions 335. It can be recognized whereby if the flexible support apparatus 100, 900 is proximate the workpiece 10 prior to the workpiece 10 being proximate the reinforcing member 40, the elongated support members 110 would begin the profiling process. The profiling process would then continue when the workpiece 10 and the reinforcing member 40 are placed proximate each other. In a fourth step 1108, the elongated support members 110 are secured in the profiled position. In a fifth step 1110, the reinforcing member 40 and the workpiece 10 are separated. In a sixth step 1112 the workpiece 10 is processed. In a seventh step 1114, the elongated support apparatus 100, 900 can reset or separate from the workpiece 10. In an eighth step 1116, the flexible support apparatus 100, 900 are separated, allowing the workpiece to continue to the next workstation of the assembly flow. In a ninth step 1108, the process can be repeated with the next workpiece 10.

What is claimed is:

1. A method for maintaining reliability of a printed circuit board support apparatus, the method comprising the steps:
    utilizing elongated support members to support a printed circuit board during a solder paste application process used to apply solder paste onto said printed circuit board,
    wherein said elongated support members are positioned in an array layout to support said printed circuit board, wherein each of the elongated support members are configured and held within apertures of a base member,
    profiling said elongated support members by adjusting a vertical position of said elongated support members within said apertures in a manner to match a profile of said printed circuit board, and
    deflecting said solder paste from impinging upon an interface between said elongated support member and said aperture of said base member using a protective collar.

2. The method of claim 1 wherein said protective collar is of a pliant material.

3. The method of claim 1 further comprising the step of protecting said printed circuit board by utilizing a compliant material positioned on said elongated support members proximate a location where said elongated support members contact said printed circuit board.

4. The method of claim 1 further comprising the step of protecting said printed circuit board by using said protective collar fabricated of a compliant material, and designing said protective collar to additionally comprise an area which covers a point of contact between said elongated support members and said printed circuit board.

5. The method of claim 1 wherein said step of deflecting said solder paste from said interface between said elongated support member and said aperture of said base member using a protective collar, wherein said protective collar is fabricated as a feature of said elongated support member.

6. The method for maintaining reliability of a printed circuit board support apparatus of claim 1, further comprising a step of:
    applying a holding force to said elongated support members in said profiled position.

7. The method for maintaining reliability of a printed circuit board support apparatus of claim 3, further comprising a step of:
    applying a holding force to said elongated support members in said profiled position.

* * * * *